United States Patent [19]

Ramdani et al.

[11] Patent Number: 5,633,886
[45] Date of Patent: May 27, 1997

[54] SHORT WAVELENGTH VCSEL WITH AL-FREE ACTIVE REGION

[75] Inventors: Jamal Ramdani, Gilbert; Michael S. Lebby, Apache Junction, both of Ariz.; Hsing-Chung Lee, Calabasas, Calif.

[73] Assignee: Motorola, Schaumburg, Ill.

[21] Appl. No.: 520,061

[22] Filed: Aug. 28, 1995

[51] Int. Cl.$^6$ .................................................. H01S 3/19
[52] U.S. Cl. .................................. 372/45; 372/92; 372/99
[58] Field of Search ............................. 372/45, 92, 99, 372/96

[56] References Cited

U.S. PATENT DOCUMENTS 5,172,384  12/1992  Goronkin et al. ..................... 372/45
5,509,026  4/1996   Sasaki et al. ......................... 372/45
5,513,202  4/1996   Kobayashi et al. ................... 372/96
5,559,818  9/1996   Shono et al. ......................... 372/45

Primary Examiner—James W. Davie
Attorney, Agent, or Firm—Eugene A. Parsons

[57] ABSTRACT

A short wavelength VCSEL including a mirror stack positioned on a substrate, formed of a plurality of pairs of relatively high and low index of refraction layers a second mirror stack formed of a plurality of pairs of relatively high and low index of refraction layers, an active region sandwiched between the first stack and the second stack, the active region being formed of quantum well layers of GaAsP having barrier layers of GaInP sandwiched therebetween, the quantum well and barrier layers having substantially equal and opposite lattice mismatch.

24 Claims, 2 Drawing Sheets

SHORT WAVELENGTH VCSEL WITH AL-FREE ACTIVE REGION

FIELD OF THE INVENTION

The present invention pertains to vertical cavity surface emitting lasers and more specifically to short wavelength vertical cavity surface emitting lasers and improved methods of fabrication.

BACKGROUND OF THE INVENTION

In prior art semiconductor lasers, as typically disclosed in U.S. Pat. No. 5,172,384, entitled "Low Threshold Current Laser", issued Dec. 15, 1992, it is common to form an active region with an InGaAs quantum well, having spacing layers and cladding layers of AlGaAs on both sides thereof. Further, it is typical to form Bragg reflectors, or mirror stacks, on each side of the cladding layers, which mirror stacks generally include aluminum. The epitaxial configuration of VCSELs is well defined, however, various processing schemes can be utilized.

Short wavelength (below approximately 800 nm, and more specifically, 780 nm) vertical cavity surface emitting laser diodes (VCSEL) are of great interest in high density CD ROM applications. To obtain short wavelength emission in a GaAs system, and to maintain the lattice match to a GaAs substrate, the laser cavity should have AlGaAs as an active layer. However, the introduction of aluminum in the active region results in loss of lasing efficiency, since aluminum is highly reactive with oxygen, and oxygen behaves as a non-radiative recombination center in most III–V materials. The oxygen incorporation can occur either during the material growth or during device processing.

It would be highly advantageous, therefore, to remedy the foregoing and other deficiencies inherent in the prior art.

Accordingly, it is an object of the present invention to provide a short wavelength VCSEL with aluminum free active region.

Another object of the present invention is to provide a short wavelength VCSEL which has increased reliability and stability under high current injection and high temperature conditions.

Yet another object of the present invention is to provide a short wavelength VCSEL with a substantial reduction in the threshold current.

And another object of the present invention is to provide a short wavelength VCSEL inherently suitable for ridge-waveguide processing.

SUMMARY OF THE INVENTION

Briefly, to achieve the desired objects of the instant invention, in accordance with a preferred embodiment thereof, provided is a short wavelength vertical cavity surface emitting laser including a substrate, a first mirror stack of a first conductivity type positioned on the substrate, the first mirror stack being formed of a plurality of pairs of relatively high and low index of refraction layers, a second mirror stack of a second conductivity type, the second mirror stack being formed of a plurality of pairs of relatively high and low index of refraction layers, and an active region sandwiched between the first mirror stack and the second mirror stack, the active region being formed of a plurality of strained layers, alternate strained layers having equal and opposite crystallographic strain.

Further provided is a method of fabricating a short wavelength vertical cavity surface emitting laser including the steps of forming a first mirror stack of a first conductivity type, the first mirror stack being formed of a plurality of pairs of relatively high and low index of refraction layers, forming a first confining layer on the first mirror stack, forming an active region on the first confining layer, the active region being formed of a plurality of strained layers, alternate strained layers having equal and opposite crystallographic strain, forming a second confining layer on the active region, and forming a second mirror stack of a second conductivity type on the second confining layer, the second mirror stack being formed of a plurality of pairs of relatively high and low index of refraction layers.

BRIEF DESCRIPTION OF THE DRAWINGS

Referring to the drawings.

DESCRIPTION OF THE PREFERRED EMBODIMENTS

Figure 1:
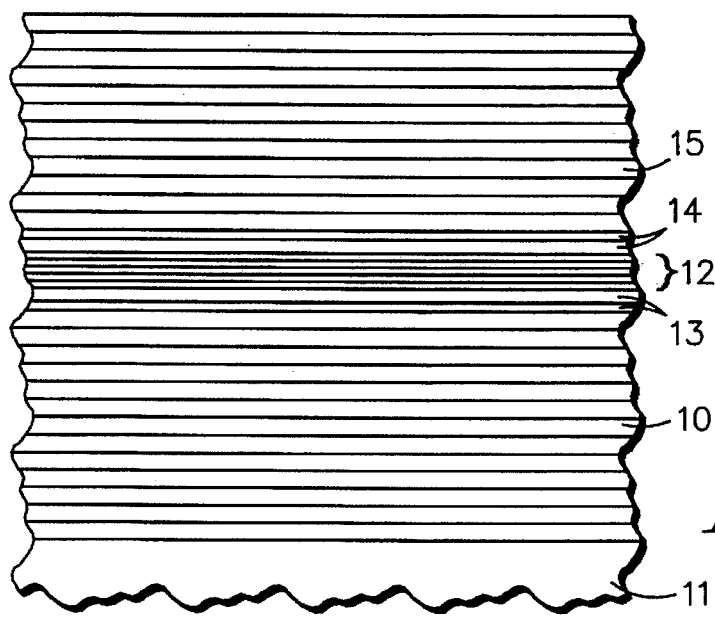
FIG. 1 is a simplified sectional view of a first stage in the fabrication of a VCSEL in accordance with the present invention.

Referring to FIG. 1, a simplified sectional view of an intermediate structure realized in various different steps of a fabrication method in accordance with the present invention are illustrated. In particular, FIG. 1 illustrates a first mirror stack 10 formed, for example, by epitaxially growing a plurality of layers of semiconductor material with alternating indexes of refraction on a substrate 11. An example of materials that can be used for this purpose is alternating layers of AlAs and $Al_{0.25}Ga_{0.75}As$. Each pair of alternating layers are grown to a thickness of one quarter of the emission wavelength propagating in the layers, and the number of pairs is chosen to provide as much reflectivity of light as possible while limiting the stack to a practical number.

An active region 12 is sandwiched between a first confining layer or region 13 and a second confining layer or region 14. Confining region 13 is positioned on first mirror stack 10, and a second mirror stack 15 is formed on an upper surface of confining region 14. Second mirror stack 15 is, for example formed by epitaxially growing pairs of semiconductor layers as described in conjunction with mirror stack 10. Generally, the pairs of layers will be formed of materials similar to those of mirror stack 10 and the thicknesses will be similar to provide the proper reflectivity of a selected wavelength or spectrum of wavelengths. Also, the first and second mirror stacks 10, 15 are doped with opposite conductivity types to form a two terminal (diode) structure for the flow of electrical current therethrough. In this specific embodiment, for example, mirror stack 10 is doped for n-type conductivity and mirror stack 15 is doped for p-type conductivity.

Active region 12 generally includes one or more quantum wells, or quantum well layers, separated by barrier layers with confining layers 13 and 14 on either side thereof. The quantum wells, barrier layers, and confinement layers are also grown epitaxially. The quantum wells produce photons (light) in accordance with a well known phenomenon when properly energized by electrical current applied thereacross. In general, the greater the current applied to active region 12 the greater the number of photons generated. The photons are reflected by mirror stacks 10 and 15 and produce the well known lasing effect that ultimately produces the emitted light. The wavelength of the light is determined by the materials utilized in the quantum well or wells in active region 12 and the thickness of the alternating pairs of layers in mirror stacks 10 and 15.

Active region 12 is formed with a material system selected to provide light emissions of short wavelength, such as wavelengths below 800 nm and preferably 780 nm. Generally, the short wavelengths are achieved using an aluminum alloy. However, aluminum is susceptible to oxidation and contributes substantially to the unreliability of active region 12, eventually resulting in the failure of the VCSEL. Therefore the material system forming active region 12 does not contain aluminum. Confining layer 14 is formed from a material system different than the material system of mirror stack 15 with the different material system being chosen so that mirror stack 15 can be selectively etched to form a patterned mirror, or ridge type, VCSEL if desired. By selecting the material system of active region 12 so that it does not contain aluminum and by selecting the different material system of confining layer 14 so that it is crystalographically compatible with the material system of active region 12, the reliability and lifespan of the VCSEL is improved.

Figure 2:
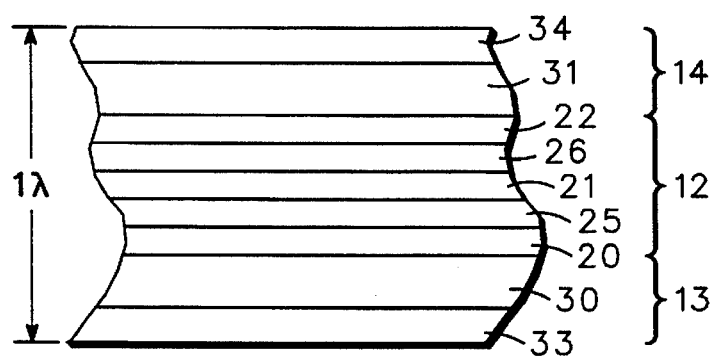
FIG. 2 is a greatly enlarged sectional view of a portion of the structure of FIG. 1.

Referring specifically to FIG. 2, a greatly enlarged and simplified sectional view of active region 12 sandwiched between confining layers 13 and 14 is illustrated. In this specific embodiment, active region 12 includes three quantum wells 20, 21 and 22 formed with barrier layers 25 and 26 sandwiched therebetween. Quantum wells 20, 21 and 22 separated by barrier layers 25 and 26 are sandwiched between spacer or guiding layers 30 and 31 which are in turn sandwiched between cladding layers 33 and 34. Generally spacer layers 30 and 31 and cladding layers 33 and 34 are graded to provide guiding action, as described in more detail in U.S. Pat. No. 5,172,384, described above and included herein by reference.

To utilize aluminum free material in active region 12, a $GaAs_{(1-x)}P_x$ is incorporated. However, $GaAs_{(1-x)}P_x$ is not lattice matched to GaAs, and a tensile strain is induced. In a multiple quantum well structure, in order to accommodate this strain without generation of misfit dislocations, the thickness of the GaAsP layers is kept small enough and an equal and opposite compensation of this strain is needed. The preferred material system for active region 12 is a GaInP/GaAsP strained layers superlattice. Quantum well layers 20, 21 and 22 under tensile strain and interspersed barrier layers 25 and 26 under substantially equal compressive strain are utilized.

Figure 3:
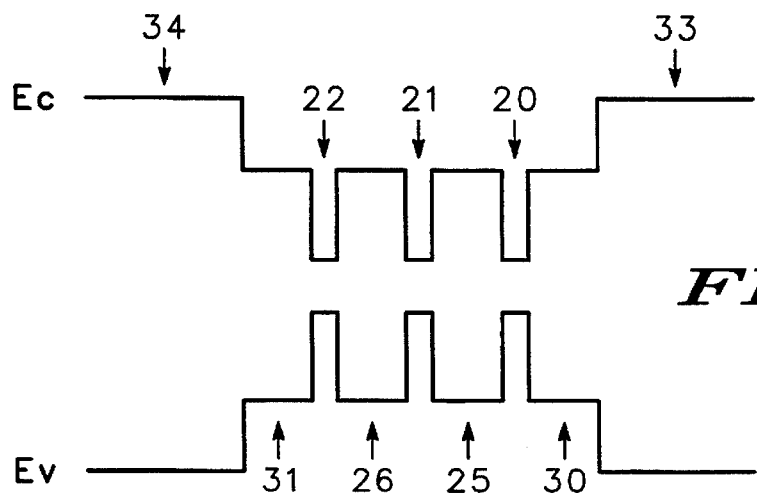
FIG. 3 is an energy diagram generally portraying the bandgaps for the materials utilized in the structure illustrated in FIG. 2.

In a specific example, quantum well layers 20, 21 and 22 are formed of $GaAs_{0.82}P_{0.18}$ ($E_g$=1.57 eV) each approximately 100 angstroms thick. Barrier layer 25 and 26 are formed of $In_{0.59}Ga_{0.41}P$ ($E_g$=1.76 eV) each approximately 100 angstroms thick. Quantum well layer 20, 21 and 22 and barrier layers 25 and 26 have approximately equal and opposite lattice mismatch of approximately 0.65% with respect to GaAs substrate 11. The phosphorous composition in GaAsP is chosen so as to produce an emission wavelength of 780 nm at room temperature, taking into account both the quantum well size and strain effects on the energy bands. Spacer layers 30 and 31 are formed of $In_{0.49}Ga_{0.51}P$ ($E_g$=1.9 eV) and cladding layers 33 and 34 are formed of $(GaAl_{0.3})_{0.51}In_{0.49}P$ ($E_g$=2.08 eV), lattice matched to GaAs substrate 11. The total thickness of active region 12 and confining layers 13 and 14 is chosen to be one full wavelength optical thickness. An energy diagram generally portraying the bandgaps for the materials described are illustrated in FIG. 3. In this example, the Bragg reflectors (first and second mirror stacks 10 and 15) are composed of one quarter wavelength alternating layers of AlAs and $Ga_{0.75}Al_{0.25}As$.

Figure 4:
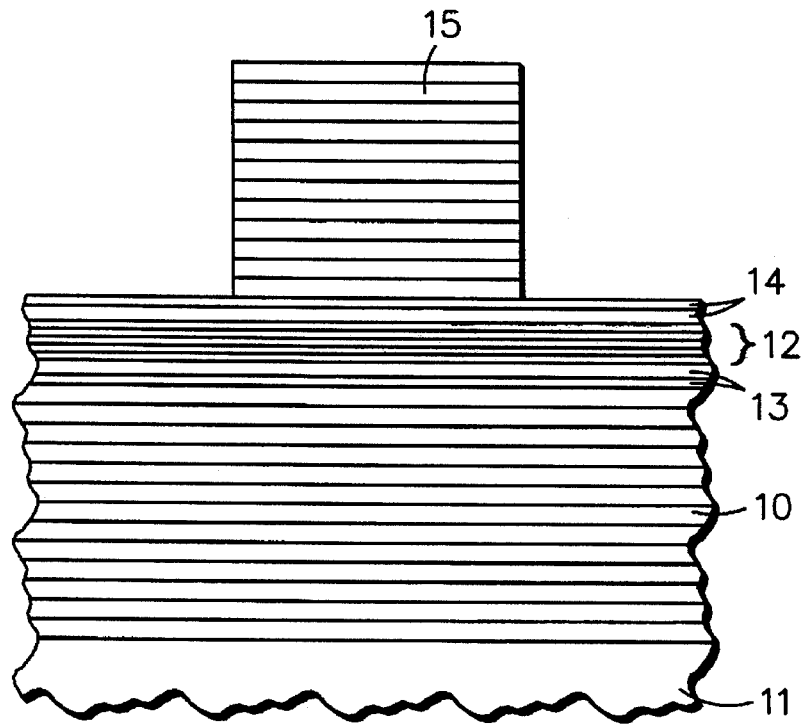
FIG. 4 is a simplified sectional view of a second stage in the fabrication of a VCSEL in accordance with the present invention.

With first mirror stack 10, confining layer 13, active region 12, confining layer 14 and second mirror stack 15 formed on substrate 11 as illustrated in FIG. 1 and including materials as described above, second mirror stack 15 is selectively etched, as illustrated in FIG. 4. Either wet or dry etch techniques can be performed, using $H_2O_2$:$H_2O$:$H_2SO_4$/ HCL:$H_3PO_4$ based etchants. Do to the etch selectivity, pattern mirror, or ridge waveguide, VCSEL structures are formed by etching through top or second mirror stack 15, down to the top surface of cladding layer 34. Because the etching is accurate and does not damage active region 12 or confining layers 13 and 14, good electrical current and optical confinement is achieved to obtain low thresholds, while still maintaining good reliability (relative to a planar VCSEL).

Figure 5:
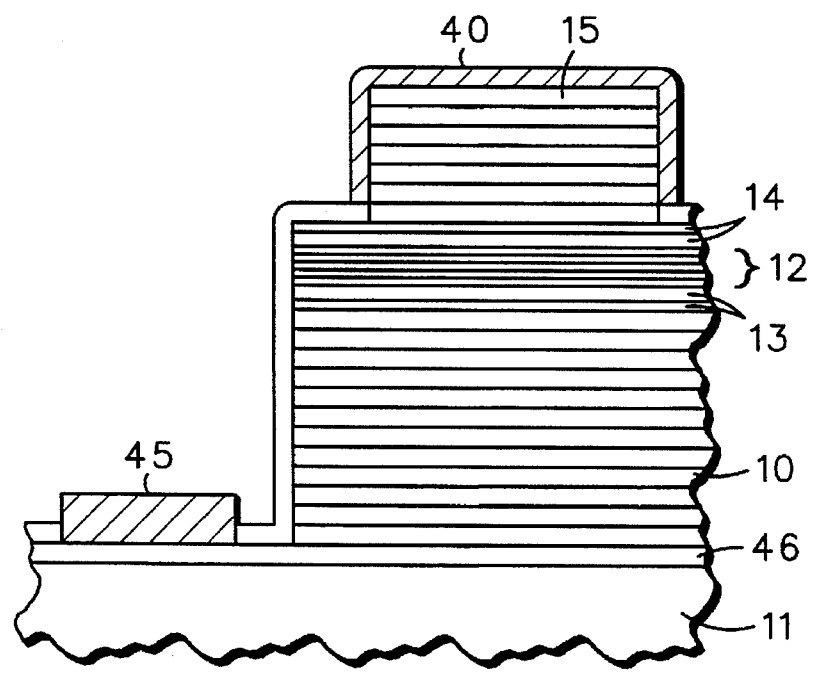
FIG. 5 is a simplified section view of a final stage in the fabrication of a VCSEL in accordance with the present invention.

As illustrated in FIG. 5, to complete the structure illustrated in FIG. 4, a p-type metallization 40 is formed on the exposed surface of upper mirror stack 15 by any known method. At least the portion of p-type metallization 40 overlying the upper surface of the mesa may be a transparent metal, such as ITO or the like. An n-type metallization 45 is formed in contact with mirror stack 10, for example on the upper surface of substrate 11, to provide another electrical contact for the VCSEL. Generally, a layer 46 of heavily doped semiconductor material is provided on the surface of substrate 11 to provide a better, low resistance contact to mirror stack 10 of the VCSEL. It will be understood that an electrical contact can be formed on the surface of substrate 11 opposite the surface on which mirror stack 10 is formed, if desired.

Thus a new and improved method of fabricating short wavelength VCSELs is disclosed including an improved method of fabricating patterned-mirrors for VCSELs is disclosed. Because the upper mirror stack is accurately and selectively etched reliability is substantially increased. Also, because the active region of the VCSELs is aluminum free, the reliability and the lifespan of the VCSELs is substantially increased.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A short wavelength vertical cavity surface emitting laser comprising:
   a substrate;
   a first mirror stack of a first conductivity type positioned on the substrate, the first mirror stack being formed of a plurality of pairs of relatively high and low index of refraction layers;
   a second mirror stack of a second conductivity type, the second mirror stack being formed of a plurality of pairs of relatively high and low index of refraction layers; and an active region sandwiched between the first mirror stack and the second mirror stack, the active region being formed of a plurality of strained layers, alternate strained layers having equal and opposite crystallographic strain.

2. A short wavelength vertical cavity surface emitting laser as claimed in claim 1 wherein the active region is formed of materials which generate light at a wavelength shorter than approximately 800 nm.

3. A short wavelength vertical cavity surface emitting laser as claimed in claim 2 wherein the materials are aluminum free.

4. A short wavelength vertical cavity surface emitting laser as claimed in claim 3 further includes the active region sandwiched between a pair of confining layers.

5. A short wavelength vertical cavity surface emitting laser as claimed in claim 4 wherein the active region further includes a plurality of quantum well layers having tensile strain and alternate barrier layers having substantially equal compressive strain sandwiched therebetween.

6. A short wavelength vertical cavity surface emitting laser as claimed in claim 5 wherein the plurality of quantum well layers are formed of GaAsP and the barrier layers are formed of GaInP.

7. A short wavelength vertical cavity surface emitting laser as claimed in claim 6 wherein the confining layers each include a spacer layer and a cladding layer.

8. A short wavelength vertical cavity surface emitting laser as claimed in claim 7 wherein the spacer layers are formed of InGaP.

9. A short wavelength vertical cavity surface emitting laser as claimed in claim 8 wherein the cladding layers are formed of GaAlInP.

10. A short wavelength vertical cavity surface emitting laser as claimed in claim 6 wherein the active region and the confining layer are formed approximately one optical wavelength thick.

11. A short wavelength vertical cavity surface emitting laser as claimed in claim 9 wherein the compressive strain and the tensile strain form a lattice mismatch of the quantum well layers and adjacent barrier layers of approximately 0.65%.

12. A short wavelength vertical cavity surface emitting laser as claimed in claim 11 wherein the GaAsP quantum well layers are formed in accordance with the formula $GaAs_{(1-x)}P_x$.

13. A short wavelength vertical cavity surface emitting laser as claimed in claim 12 wherein the GaAsP quantum well layers are $GaAs_{0.82}P_{0.18}$.

14. A short wavelength vertical cavity surface emitting laser as claimed in claim 13 wherein the InGaP barrier layers are formed of $In_{0.59}Ga_{0.41}P$.

15. A short wavelength vertical cavity surface emitting laser as claimed in claim 14 wherein the spacer layer is formed of $In_{0.49}Ga_{0.51}P$.

16. A short wavelength vertical cavity surface emitting laser as claimed in claim 15 wherein the cladding layer is formed of $(GaAl_{0.3})_{0.51}In_{0.49}P$.

17. A short wavelength vertical cavity surface emitting laser comprising:

a substrate;

a first mirror stack of a first conductivity type positioned on the substrate, the first mirror stack being formed of a plurality of pairs of relatively high and low index of refraction layers;

a second mirror stack of a second conductivity type, the second mirror stack being formed of a plurality of pairs of relatively high and low index of refraction layers; and an active region sandwiched between the first mirror stack and the second mirror stack, the active region being formed of a plurality of quantum well layers of GaAsP having barrier layers of GaInP sandwiched therebetween, the quantum well layers and the barrier layers having substantially equal and opposite lattice mismatch; the active region being sandwiched between a pair of confining layers.

18. A short wavelength vertical cavity surface emitting laser as claimed in claim 17 wherein the lattice mismatch of the quantum well layers and adjacent barrier layers is approximately 0.65%.

19. A short wavelength vertical cavity surface emitting laser as claimed in claim 18 wherein the GaAsP quantum well layers are formed in accordance with the formula $GaAs_{(1-x)}P_x$.

20. A short wavelength vertical cavity surface emitting laser as claimed in claim 19 wherein the GaAsP quantum well layers are $GaAs_{0.82}P_{0.18}$.

21. A short wavelength vertical cavity surface emitting laser as claimed in claim 20 wherein the InGaP barrier layers are formed of $In_{0.59}Ga_{0.41}P$.

22. A short wavelength vertical cavity surface emitting laser as claimed in claim 21 wherein the confining layers each include a spacer layer and a cladding layer.

23. A short wavelength vertical cavity surface emitting laser as claimed in claim 22 wherein the spacer layer is formed of $In_{0.49}Ga_{0.51}P$.

24. A short wavelength vertical cavity surface emitting laser as claimed in claim 23 wherein the cladding layer is formed of $(GaAl_{0.3})_{0.51}In_{0.49}P$.

* * * * *